(12) United States Patent
Min et al.

(10) Patent No.: US 12,424,743 B2
(45) Date of Patent: Sep. 23, 2025

(54) SCALABLE AND RECONFIGURABLE PHASED ARRAY ANTENNA AND METHOD FOR MANUFACTURING THE SAME

(71) Applicant: UIF (University Industry Foundation), Yonsei University, Seoul (KR)

(72) Inventors: Byung-Wook Min, Seoul (KR); Young Joo Lee, Seoul (KR); Kyu Jong Choi, Seoul (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 385 days.

(21) Appl. No.: 18/169,255

(22) Filed: Feb. 15, 2023

(65) Prior Publication Data
US 2024/0006761 A1   Jan. 4, 2024

(30) Foreign Application Priority Data
Jul. 1, 2022   (KR) .................. 10-2022-0081098

(51) Int. Cl.
*H01Q 3/36* (2006.01)
*H01L 21/78* (2006.01)

(52) U.S. Cl.
CPC .............. *H01Q 3/36* (2013.01); *H01L 21/78* (2013.01)

(58) Field of Classification Search
CPC ........ H01Q 3/36; H01Q 3/30; H01Q 21/0025; H01Q 21/06; H01Q 3/26; H01Q 21/061; H01L 21/78
See application file for complete search history.

(56) References Cited

U.S. PATENT DOCUMENTS

| | | | |
|---|---|---|---|
| 10,720,715 B2 * | 7/2020 | Abiri | H01Q 21/064 |
| 10,833,408 B2 * | 11/2020 | Paulsen | H01Q 3/40 |
| 2022/0247075 A1 * | 8/2022 | Jalili | H01Q 3/30 |

FOREIGN PATENT DOCUMENTS

| | | |
|---|---|---|
| KR | 10-1181465 B1 | 9/2012 |
| KR | 10-2019-0005746 A | 1/2019 |
| KR | 10-2386473 B1 | 4/2022 |

OTHER PUBLICATIONS

K.-J. Choi and B.-W. Min, "E-band Power Forward and Divider Switch for On-Chip Reconfigurable and Scalable Arrays," 2022 IEEE/MTT-S International Microwave Symposium—IMS 2022, Denver, CO, USA, 2022, pp. 259-262, doi: 10.1109/IMS37962.2022.9865416.

W. Shin et al., "A 108-114 GHz 4×4 Wafer-Scale Phased Array Transmitter With High-Efficiency On-Chip Antennas," in IEEE Journal of Solid-State Circuits, vol. 48, No. 9, pp. 2041-2055, (May 15, 2013).

H. M. Al-Tamimi., "A Study of Reconfigurable Multiband Antenna for Wireless Application", IJNTR, vol. 2, Issue-5, pp. 125-134, (May 31, 2016).

* cited by examiner

*Primary Examiner* — Ladimir Magloire
*Assistant Examiner* — Anna K. Gosling (57) ABSTRACT

A phased array antenna comprises a plurality of unit cells arranged in an array. Each of the plurality of unit cells comprises: at least one radiating element receiving a feed signal and radiating a signal; and two path changeover switches for transmitting the applied feed signal as it is or as a distribution to the at least one radiating element, or at least one unit cell disposed adjacent, under control of an antenna control circuit.

18 Claims, 10 Drawing Sheets

SCALABLE AND RECONFIGURABLE PHASED ARRAY ANTENNA AND METHOD FOR MANUFACTURING THE SAME

CROSS-REFERENCE TO RELATED APPLICATIONS

This application claims priority under 35 U.S.C. § 119(a) to Korean Patent Application No. 10-2022-0081098, filed on Jul. 1, 2022, in the Korean Intellectual Property Office, the disclosure of which is incorporated herein in its entirety by reference.

BACKGROUND

1. Technical Field

Embodiments described herein relate to a phased array antenna and a method for manufacturing the same, more particularly to a scalable and reconfigurable phased array antenna and a method for manufacturing the same.

2. Description of the Related Art

Devices using high frequencies such as millimeter wave (mmWave) are increasing due to advantages such as providing a large bandwidth required to improve data transmission speed, but as the frequency increases, path loss also increases, limiting communication distance. In order to overcome communication distance limitations due to such path loss, communication devices using ultra-high frequencies such as millimeter waves mainly use beam-forming technology based on phased array technology.

In a conventional phased array antenna for beam-forming, a plurality of core chips for beam-forming are implemented in an array pattern according to a designated pattern such as 2×2 or 4×4 on a printed circuit board (hereinafter, PCB). However, as the frequency of the signal transmitted by the antenna increases, not only does the transition loss between the chip and the PCB increase, but also the spacing between the radiating elements must be narrowed, so the size of the array must be as small as the size of the core chip. This complicates array implementation.

In order to solve this problem, a wafer-scale phased array that implements a phased array antenna directly on a silicon-based wafer has recently been proposed. Since the phased array antenna is implemented directly on the wafer level in the wafer scale phased array, it is possible to solve the transition from chip to PCB and implementation complexity caused by arranging a plurality of antennas conventionally implemented with a plurality of chips on a PCB in an array.

However, in the case of a wafer-scale phased array antenna implemented at the existing wafer level, the number of antenna radiating elements included in the phased array antenna and the corresponding array size and arrangement position are determined in advance, and a power distribution path and the like according to the determined positions of the radiating elements is also determined. That is, the structure of the phased array antenna is fixedly determined, and the phased array antenna is implemented at a wafer level according to the determined structure.

However, antenna structures required in various communication devices are not only very diverse, but also need to use various types of phased array antennas depending on the use environment, but existing phased array antennas can be used only in a single fixed structure, which limits their usability. In addition, since a plurality of phased array antennas having a fixed pattern are formed at the wafer level, there is a problem in that the efficiency of using the wafer due to the yield is lowered.

STATEMENT REGARDING PRIOR DISCLOSURES BY THE INVENTOR OR A JOINT INVENTOR

At least one inventor or joint inventor of the present disclosure has made related disclosures in 2022 IEEE/MTT-S International Microwave Symposium—IMS 2022—on Jun. 21, 2022.

SUMMARY

An object of the present disclosure is to provide a phased array antenna in which a plurality of unit cells having the same structure are repeatedly arranged and implemented on a wafer, and a plurality of unit cells can be distinguished and used according to various sizes and shapes required, and a method for manufacturing the same.

Another object of the present disclosure is to provide a phased array antenna that can be variably used in a combination of various sizes and patterns according to the application, and a method for manufacturing the same.

Another object of the present disclosure is to provide a phased array antenna and a method for manufacturing the same, which can greatly improve yield because the phased array antenna can be reconfigured in various sizes and patterns at the wafer level.

A phased array antenna according to an embodiment of the present disclosure, conceived to achieve the objectives above, comprises a plurality of unit cells arranged in an array, wherein each of the plurality of unit cells comprises: at least one radiating element receiving a feed signal and radiating a signal; and two path changeover switches for transmitting the applied feed signal as it is or as a distribution to the at least one radiating element, or at least one unit cell disposed adjacent, under control of an antenna control circuit.

The phased array antenna may be manufactured and implemented on a wafer, and may be obtained in multiple numbers by sawing so that the plurality of unit cells are included in different numbers and patterns according to the application purpose in the wafer.

The phased array antenna may be manufactured and implemented on a wafer, and if at least one unit cell among the plurality of unit cells implemented on the wafer is determined to be defective, may be obtained by changing the location on the wafer or by changing the number of included unit cells and the pattern, so that the unit cells determined to be defective are excluded.

The phased array antenna may be divided and reconfigured into a plurality of sub-phased array antennas by grouping the plurality of unit cells with a number corresponding to the number of feed signals independently input to the phased array antenna.

Each of the plurality of sub-phased array antennas receives a feed signal through one unit cell among a plurality of included unit cells, and the two path changeover switches may be controlled such that a feed signal input to one unit cell by the antenna control circuit is transmitted between unit cells within the same sub-phased array antenna.

The phased array antenna may be divided and reconfigured into a number of sub-phased array antennas corresponding to the number of feed signals independently input to the phased array antenna.

Each of the plurality of sub-phased array antennas receives a feed signal through one unit cell among a plurality of included unit cells, and the two path changeover switches may be controlled such that a feed signal input to one unit cell by the antenna control circuit is transmitted between unit cells within the same sub-phased array antenna.

Each of the two path changeover switches may operate in one of a forward mode in which the feed signal is transmitted in the applied forward direction, and a divide mode in which the feed signal is divided into two and transmitted in both side directions of the forward direction, under the control of the antenna control circuit, such that the feed signal is transmitted to another path changeover switch in the same unit cell or the at least one radiating element or at least one adjacently disposed unit cell.

The two path changeover switches may include: a first path changeover switch that transmits the feed signal to at least one of the adjacently disposed unit cell and another path changeover switch in the same unit cell; and a second path changeover switch that transmits the feed signal to at least one of the at least one radiating element and the first path changeover switch in the same unit cell and the adjacently disposed unit cell.

Each of the plurality of unit cells may further include a selection switch that selects one of the second path changeover switch in the same unit cell or the second path changeover switch of an adjacent unit cell, and transmits a feed signal applied through the selected second path changeover switch to the at least one radiating element.

The path changeover switch may include: a line coupler including a pair of coupling lines disposed parallel to each other to achieve mutual coupling; and four mode switches, connected between each of the four ports to which the feed signal is applied or output to both ends of each of the pair of coupling lines and a ground voltage, and turned on or off under the control of the antenna control circuit to determine the operation mode of the path changeover switch and the transmission direction of the feed signal.

In the four mode switches, when the path changeover switch operates in the forward mode, two mode switches connected to a port to which the feed signal is applied and a port to which the feed signal is to be transmitted may be turned off and the remaining two mode switches may be turned on, and when the path changeover switch operates in the divide mode, all of them may be turned off.

Each of the two path changeover switches may further include a distribution capacitor connected between the pair of coupling lines.

Each of the plurality of unit cells may further include a phase control circuit for adjusting the phase of the feed signal applied to the at least one radiating element under the control of the antenna control circuit.

A method for manufacturing a phased array antenna according to an embodiment of the present disclosure, conceived to achieve the objectives above, comprises the steps of: arranging, on a wafer, a plurality of unit cells comprising at least one radiating element receiving a feed signal and radiating a signal and two path changeover switches for transmitting the applied feed signal as it is or as a distribution to the at least one radiating element, or at least one unit cell disposed adjacent, under control of an antenna control circuit; obtaining at least one cell array by dividing and sawing the plurality of unit cells into different numbers and patterns according to the application in the plurality of unit cells arranged in an array on the wafer; and configuring the phased array antenna by controlling the two path changeover switches such that a transmission path through which the feed signal is transmitted is determined in a plurality of unit cells included in each of the cell arrays obtained by the antenna control circuit, and the feed signal is transmitted according to the determined transmission path.

Accordingly, the phased array antenna and method for manufacturing the same according to an embodiment of the present disclosure can allow the phased array antenna to be implemented by repeatedly disposing a plurality of unit cells having the same structure on a wafer, and to classify a plurality of unit cells according to various sizes and shapes required so that each can be used as a different phased array antenna. Therefore, it is possible not only to implement phased array antennas of various sizes and shapes, but also to use a single phased array antenna that has already been implemented as a plurality of phased array antennas having smaller sizes and various shapes, so that a combination of phased array antennas according to the environment and application can be utilized. In addition, since a plurality of phased array antennas having different sizes and patterns can be obtained even on one wafer, even if a defect occurs in some unit cells, it is possible to obtain a phased array antenna by avoiding it, and yield can be greatly improved by minimizing the size of an unused and wasted part on a wafer.

DETAILED DESCRIPTION

Hereinafter, specific embodiments of an embodiment will be described with reference to the accompanying drawings. The following detailed description is provided to assist in a comprehensive understanding of the methods, devices and/or systems described herein. However, the detailed description is only for illustrative purposes and the present disclosure is not limited thereto.

In describing the embodiments, when it is determined that detailed descriptions of known technology related to the present disclosure may unnecessarily obscure the gist of the present disclosure, detailed descriptions thereof are omitted here. The terms used below are defined in consideration of functions in the present disclosure, but may be changed depending on the customary practice or the intention of a user or operator. Thus, the definitions should be determined based on the overall content of the present specification. The terms used herein are only for describing the embodiments, and should not be construed as limitative. Unless expressly used otherwise, a singular form includes a plural form. In the present description, the terms "including", "comprising", "having", and the like are used to indicate certain characteristics, numbers, steps, operations, elements, and a portion or combination thereof, but should not be interpreted to preclude one or more other characteristics, numbers, steps, operations, elements, and a portion or combination thereof. Also, terms such as "unit", "device", "module", "block", and the like described in the specification refer to units for processing at least one function or operation, which may be implemented by hardware, software, or a combination of hardware and software.

Wafer scale phased array antennas include on-chip or super-straight antennas, and power distribution networks such as power dividers/combiners may also be included on chip. When power dividers/combiners and distribution networks are designed to be reconfigurable, phased arrays can simply be expanded by using unit cells repeatedly, and the same wafer-scale array can be reconfigured into multiple sub-arrays. Hereinafter, based on an embodiment, a method of reconfiguring a power distribution network into a switch and controlling each circuit of an array is proposed.

Figure 1:
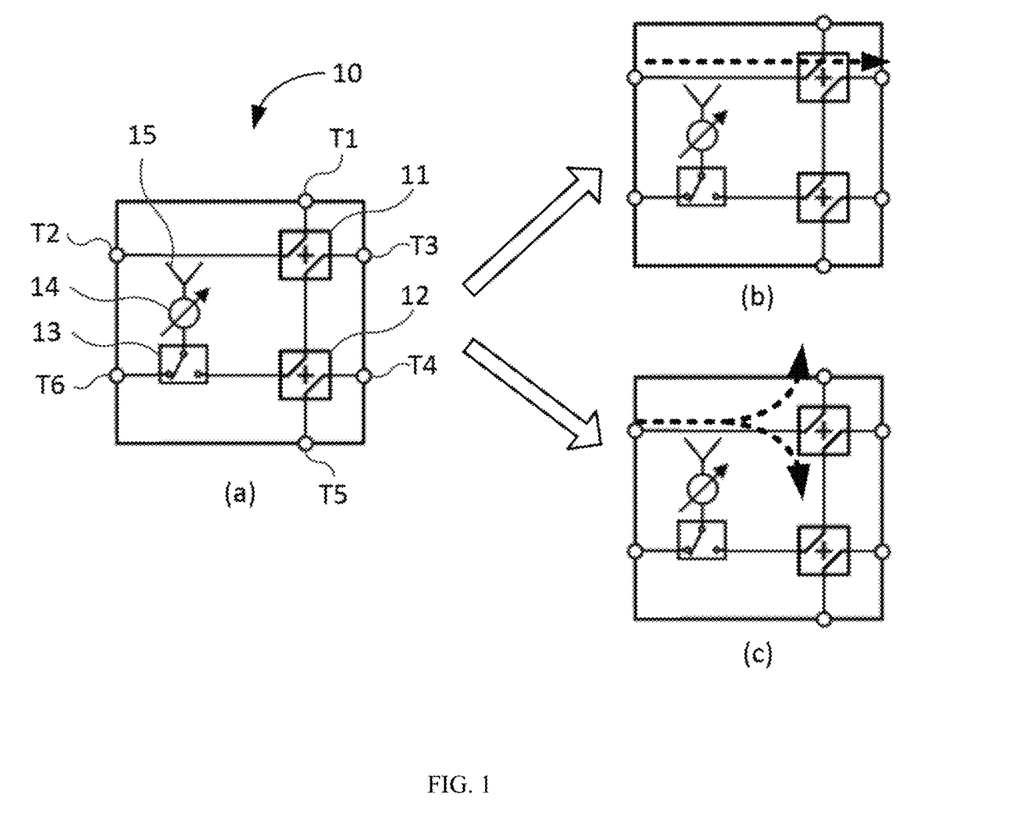
FIG. 1 shows a unit cell structure constituting a phased array antenna according to an embodiment.

FIG. 1 shows a unit cell structure constituting a phased array antenna according to an embodiment.

In FIG. 1, (a) is a diagram for explaining the configuration of the unit cell 10, and (b) and (c) are diagrams for explaining modes in which the first path changeover switch 11 of the two path changeover switches 11 and 12 transmits the applied feed signal in different ways according to modes.

The phased array antenna of the embodiment is implemented by including a plurality of unit cells 10 arranged in an array on a wafer and having the same configuration. As shown in FIG. 1, the unit cell 10 may include two path changeover switches 11 and 12, a selection switch 13, a phase control circuit 14 and at least one radiating element 15.

The two path changeover switches 11 and 12 may determine a path through which the feed signal applied to the unit cell 10 is transmitted. Each of the two path changeover switches 11 and 12 independently determines a path to transmit the applied feed signal under the control of a separate antenna control circuit, and may transmit the applied feed signal in different directions according to the determined path.

In particular, in the embodiment, the two path changeover switches 11 and 12 each are implemented as 4-port devices that receive or output the feed signal in four different directions, and when a feed signal is applied to one of the four ports, they output the applied feed signal to another port such that the feed signal is extended and transmitted in the direction in which the feed signal proceeded, or divide the applied feed signal into coupling, so that the two divided feed signals are distributed and transmitted in both side directions of the forward direction. Accordingly, operation modes of the path changeover switches 11 and 12 may be divided and set into a forward mode in which the feed signal is transmitted as it travels by the antenna control circuit as shown in (b) of FIG. 1, and a divide mode in which the feed signal is divided into two and distributed and transmitted in both side directions of the forward direction, as shown in (c) of FIG. 1.

In (b) and (c) of FIG. 1, a case is assumed in which a feed signal is input through a second terminal T2 among six terminals T1 to T6 of the unit cell 10, but the feed signal may also be input to any one of the six terminals T1 to T6.

On the basis of FIG. 1, among the six terminals T1 to T6, the first terminal T1 may be connected, when a unit cell is disposed on the upper side, to the fifth terminal T5 of the unit cell, and the third and fourth terminals T3 and T4 may be connected, when a unit cell is disposed on the right side, to the second and third terminals T2 and T6 of the unit cell. In addition, even if a unit cell is open because no adjacent unit cell is disposed on at least one side, the unit cell may also directly receive a feed signal through a terminal located on the open side. In this case, an external antenna control circuit may directly apply the feed signal.

That is, the six terminals T1 to T6 function as connection terminals for receiving or transmitting a feed signal from an antenna control circuit or an adjacently arranged unit cell.

Four ports of the first path changeover switch 11 among the two path changeover switches 11 and 12 are electrically connected to three terminals T1, T2 and T3 of the six terminals T1 to T6 of the unit cell 10 and the second path changeover switch 12. That is, the first path changeover switch 11 is connected to unit cells disposed adjacent to each other in three different directions through three terminals T1, T2 and T3, and is connected to the second path changeover switch 12 provided inside the same unit cell 10. Accordingly, the first path changeover switch 11 may receive a feed signal through one of an adjacently arranged unit cell or the second path changeover switch 12, and may transmit the applied feed signal to one or two of the second path changeover switch 12 or adjacent cells connected to the remaining ports except for one port to which the feed signal is applied.

Meanwhile, in the second path changeover switch 12, four ports are electrically connected to two terminals T4 and T5 of the six terminals T1 to T6 of the unit cell 10 and the first path changeover switch 11 and the selection switch 13. The second path changeover switch 12 may receive a feed signal through one of an adjacently arranged unit cell or the first path changeover switch 11, and may transmit the applied feed signal to one or two of the first path changeover switch 11, adjacent cells and the selection switch 13 connected to the remaining ports except for one port to which the feed signal is applied.

The radiating element 15 receives a feed signal and radiates an RF signal. The radiating element 15 may be formed of a metal having a designated pattern on one side of the unit cell 10 implemented on a wafer. In addition, the radiating element 15 may be formed spaced apart from the silicon substrate of the wafer or an insulator may be disposed therebetween. Here, only one radiating element 15 is shown for convenience of description, but the unit cell 10 may include a plurality of (for example, four) radiating elements 15.

The phase control circuit 14 adjusts the phase of the feed signal applied through the selection switch 13 and transmits it to the radiating element 15. The phase of the RF signal received through the radiating element 15 may be adjusted and transmitted to the selection switch 13. The phase control circuit 14 is configured to perform beam-forming by controlling the phase of signals radiated by a plurality of unit cells of the phased array antenna, and may adjust the phase of the feed signal according to the phase control signal applied from the external antenna control circuit. In this case, when the unit cell 10 includes a plurality of radiating elements 15, the phase control circuit 14 may individually control the phase of the feed signal applied to each radiating element 15.

Although not shown, the phase control circuit 14 may include a power AMP, a low noise AMP (LNA), a phase shifter, etc. for transmission and reception of an RF signal through the radiating element 15, and since this is a well-known technique, it will not be described in detail here.

The selection switch 13 selects one of the second path changeover switch 12 in the unit cell 10 or the sixth terminal T6 connected to the adjacently arranged unit cell and connects it to the phase control circuit 14. That is, the selection switch 13 applies the feed signal applied through one of the second path changeover switch 12 or the sixth terminal T6 to the phase control circuit 14, so that the phase control circuit 14 adjusts the phase of the feed signal and transmits it to the radiating element 15. Here, the sixth terminal T6 is connected to the second path changeover switch 12 of the adjacent unit cell through the fourth terminal T4 of the adjacently arranged (here, left) unit cell. Therefore, the selection switch 13 can be regarded as a configuration for selecting one of the second path changeover switches 12 of the same unit cell and the adjacently arranged unit cell.

According to the above structure, each of the plurality of unit cells constituting the phased array antenna of the embodiment can phase-adjust and transmit the applied feed signal to the radiating element 15 implemented in the unit cell, as well as transmit the applied feed signal to one or two adjacently arranged unit cells. Therefore, in the case of a phased array antenna in which a plurality of unit cells are arranged in an array, a transmission path through which an applied feed signal is to be transmitted to each unit cell can be freely configured in various patterns. That is, the phased array antenna can be implemented with various arbitrary patterns.

Figure 2:
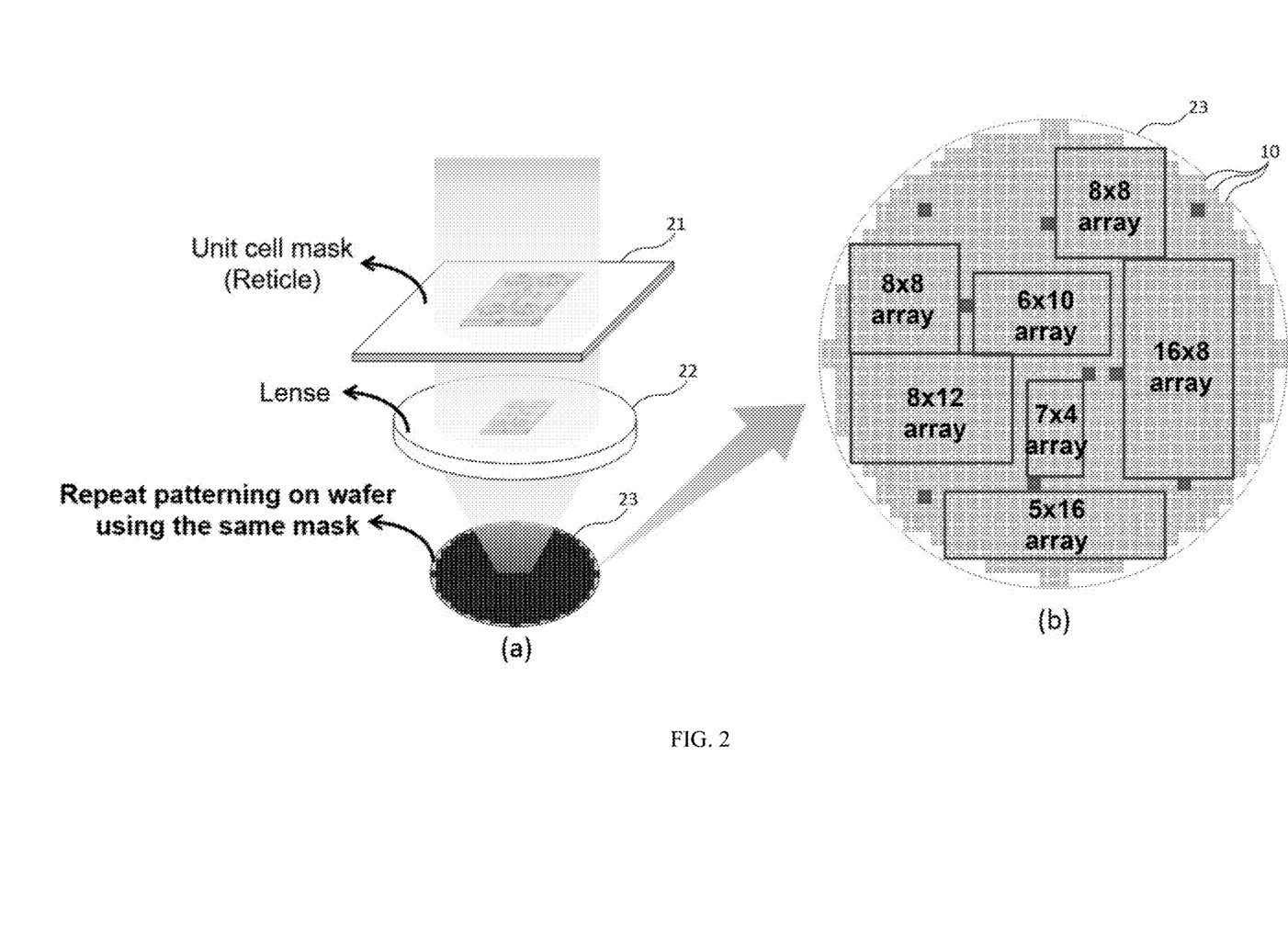
FIGS. 2 and 3 are diagrams for explaining a method of implementing a reconfigurable phased array antenna according to an embodiment and a yield change according to this.
Figure 3:
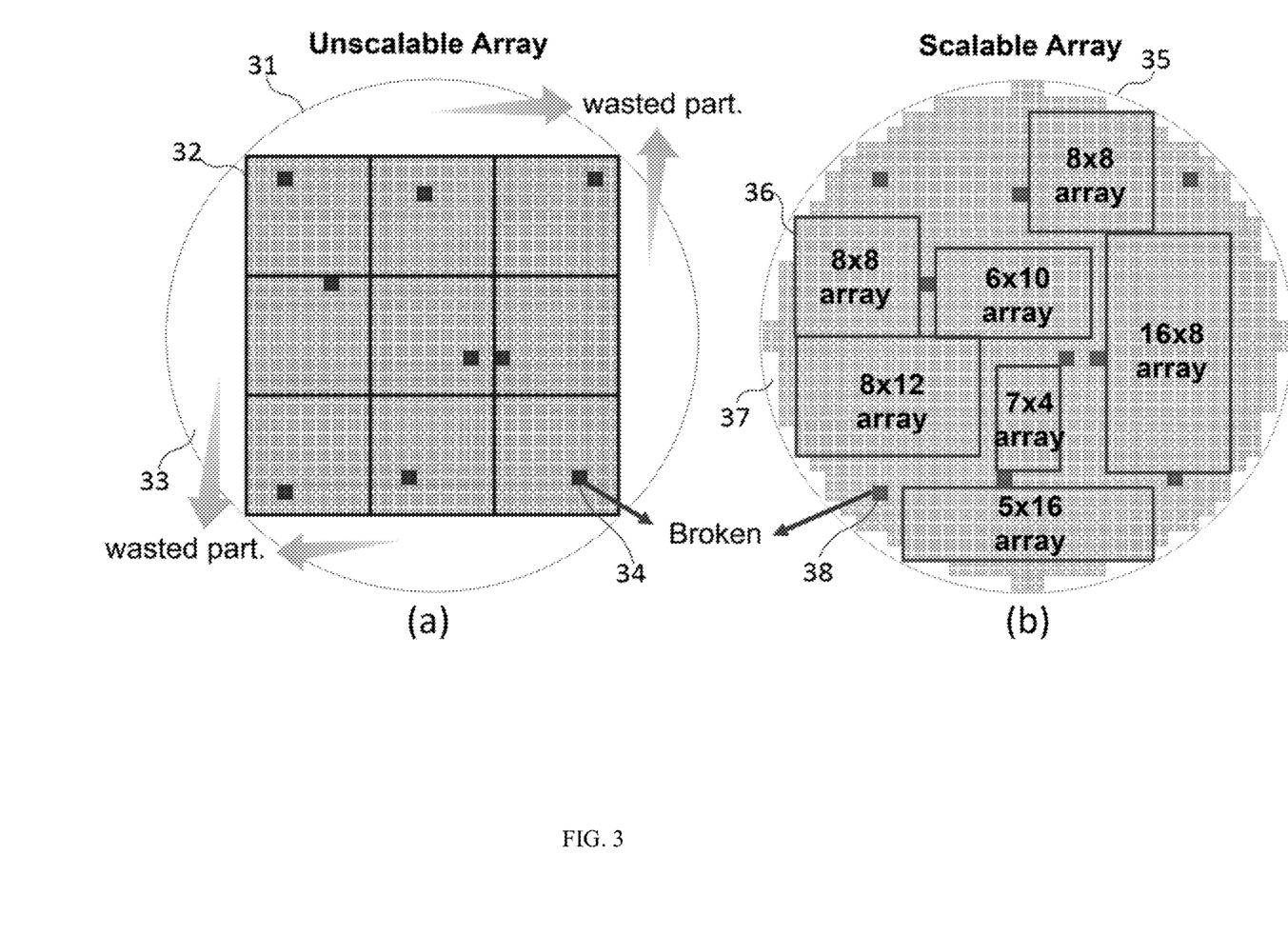

FIGS. 2 and 3 are diagrams for explaining a method of implementing a reconfigurable phased array antenna according to an embodiment and a yield change according to this.

As described above, the phased array antenna of the embodiment is composed of a plurality of unit cells 10 arranged in an array on a wafer. That is, it is implemented with a plurality of unit cells 10 implemented at a wafer level, and all of the plurality of unit cells 10 have the same circuit configuration. Therefore, as shown in (a) of FIG. 2, when a unit cell pattern mask 21 (also referred to as a reticle) is obtained for implementing one unit cell 10 on a wafer, by repeatedly implementing the unit while moving the position on the wafer using the obtained unit cell pattern mask 21, a cell array can be implemented very easily in which a plurality of unit cells are formed at a very large wafer level. Also, in some cases, an array mask may be obtained in which patterns for a plurality of unit cells are repeatedly arranged on the mask itself, and a cell array may be implemented using the obtained array mask.

If a plurality of unit cells are implemented on a wafer in this way, the phased array antenna of the embodiment can be obtained by dividing the implemented plurality of unit cells into various patterns.

As described above, each of the unit cells constituting the phased array antenna according to the embodiment may receive or transmit a feed signal through six terminals T1 to T6, and a terminal to which a feed signal is applied or transmitted may be variously controlled by two path changeover switches 11 and 12. Accordingly, the phased array antenna of the embodiment can be set in a variety of ways in terms of the number of included unit cells and arrangement form, that is, a pattern. That is, the phased array antenna of the embodiment may be implemented with any combination of a plurality of unit cells. Because of this, it is possible to obtain more phased array antennas even when using wafers of the same size, and thus yield can be greatly improved.

FIG. 3 is a diagram showing a comparison between a conventional phased array antenna obtained by being implemented at a wafer level and a phased array antenna of the embodiment. In FIG. 3, (a) shows a wafer 31 on which a conventional phased array antenna 32 is formed, and (b) shows a wafer 35 on which a phased array antenna 36 of the embodiment is formed.

Even in the case of the conventional phased array antenna 32, it may be implemented to have a cell structure similar to the unit cell of the embodiment. However, in the conventional phased array antenna 62, the number of included cells, arrangement form, and a transmission path through which a feed signal is transmitted to each cell are determined in advance. Accordingly, the number of cells determined at the time of design and the transmission path through which signals are transmitted cannot be changed. When the number and form of cells to be included in the phased array antenna 32 are determined, according to the number and form of cells as shown in (a) of FIG. 3, the number of phased array antennas 32 formed (here, 9 as an example) and positions are determined so that as many phased array antennas as possible can be obtained on a single wafer 31. In this case, a large amount of wasted part is inevitably generated that cannot be used in the wafer 31.

In addition, since the feed signal transmission path is determined in advance according to the number of cells and cell arrangement form in each phased array antenna 32, the position where the phased array antenna 32 is formed in the wafer 31 cannot be changed. Here, as a simple example, it is illustrated that a plurality of phased array antennas are formed closely adjacent to each other on a wafer, but in reality, between adjacent phased array antennas, a margin area considering a later process such as sawing may be included. However, even if the margin area is included, since the cells formed adjacent to each other cannot replace the operation on the signal transmission path of another cell, the position where the phased array antenna 32 is formed cannot be changed. Therefore, if a defective cell is generated due to various factors such as a process error (fabrication error) among a plurality of cells implemented on the wafer 31, there is a problem in that the entire phased array antenna 32 including the defective cell cannot be used. In particular, when defective cells are distributed over the entire area of the wafer 31 as shown in (a) of FIG. 3, even though the proportion of defective cells among all cells is not high, a case in which the manufactured phased array antenna 32 cannot be used may also occur. That is, there is a problem in that yield is greatly reduced even with a very small number of defective cells.

In contrast, in the phased array antenna 36 of the embodiment, not only are all unit cells 10 implemented with the same structure, but also the transmission path of the feed signal can be arbitrarily changed. As described above, each of the unit cells constituting the phased array antenna according to the embodiment may receive or transmit a feed signal through six terminals T1 to T6, and a terminal to which a feed signal is to be applied or transmitted can be variously controlled by two path changeover switches 11 and 12. Accordingly, the phased array antenna of the embodiment can be set in a variety of ways in terms of the number of included unit cells and arrangement form, that is, a pattern. That is, it is okay to determine the transmission path of the feed signal after the process at the wafer level. Therefore, the number and arrangement pattern of the unit cells included in the phased array antenna 36 can also be arbitrarily set in a variety of ways, so that it can be implemented with any combination of a plurality of unit cells.

As an example, the phased array antenna 36 may have unit cells in a 4×4 array or an 8×8 array, but may include unit cells in various numbers such as a 5×5 array, a 7×7 array, and a 10×10 array. In addition, the number of unit cells disposed in the row direction and the column direction may be different. That is, as shown in (b) of FIG. 3, the phased array antenna may be configured with unit cells arranged in various patterns such as a 6×10 array, an 8×12 array, a 7×4 array, and a 5×16 array. Also, in some cases, it may be configured with unit cells arranged in an array according to an arbitrary shape other than a rectangle.

Accordingly, as shown in (b) of FIG. 3, when the phased array antenna 36 of the embodiment is manufactured, as many unit cells 10 as possible are formed on the wafer 35, it is possible to greatly reduce the meaninglessly wasted part in the wafer 35. In addition, after checking the location of the defective unit cell 38 determined to be defective by performing a defect inspection on each of a plurality of unit cells, while avoiding the location of the defective unit cell 38, phased array antennas 36 of various sizes are constructed within the usable area on the wafer. That is, in the embodiment, the phased array antenna 36 can be configured not to have the same size and pattern, but to have various sizes and patterns. And it can be obtained individually by sawing each phased array antenna 36 constructed on the wafer 35. In this way, when the phased array antenna 36 can be implemented in various sizes, patterns and positions on the wafer, even if defective unit cells are generated, the phased array antenna 36 can be obtained while minimizing a part that can not be utilized, so that the yield of the phased array antenna 36 can be greatly improved.

Figure 4:
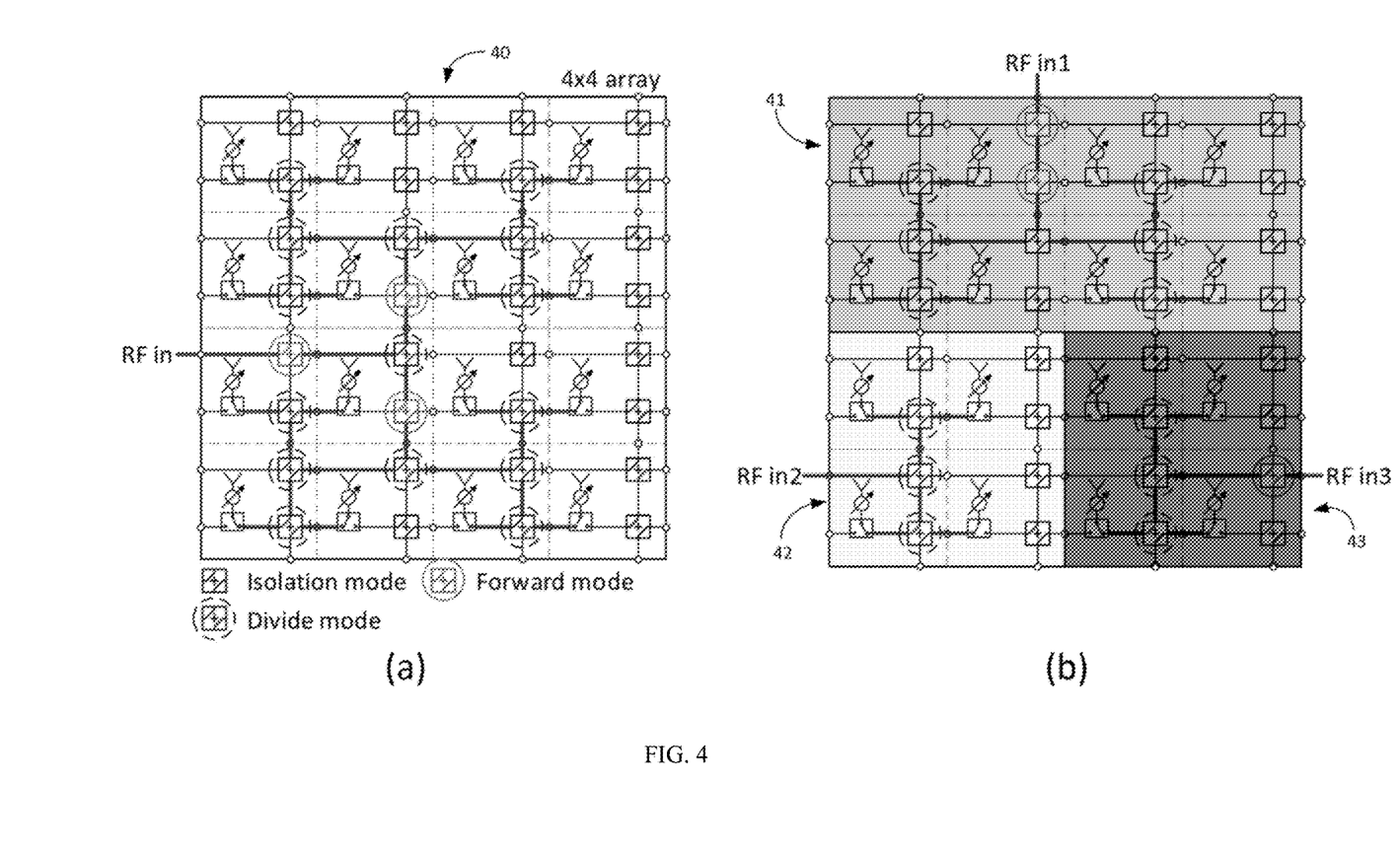
FIGS. 4 to 6 show examples of reconfiguration utilization of a phased array antenna composed of a plurality of unit cells.
Figure 5A:
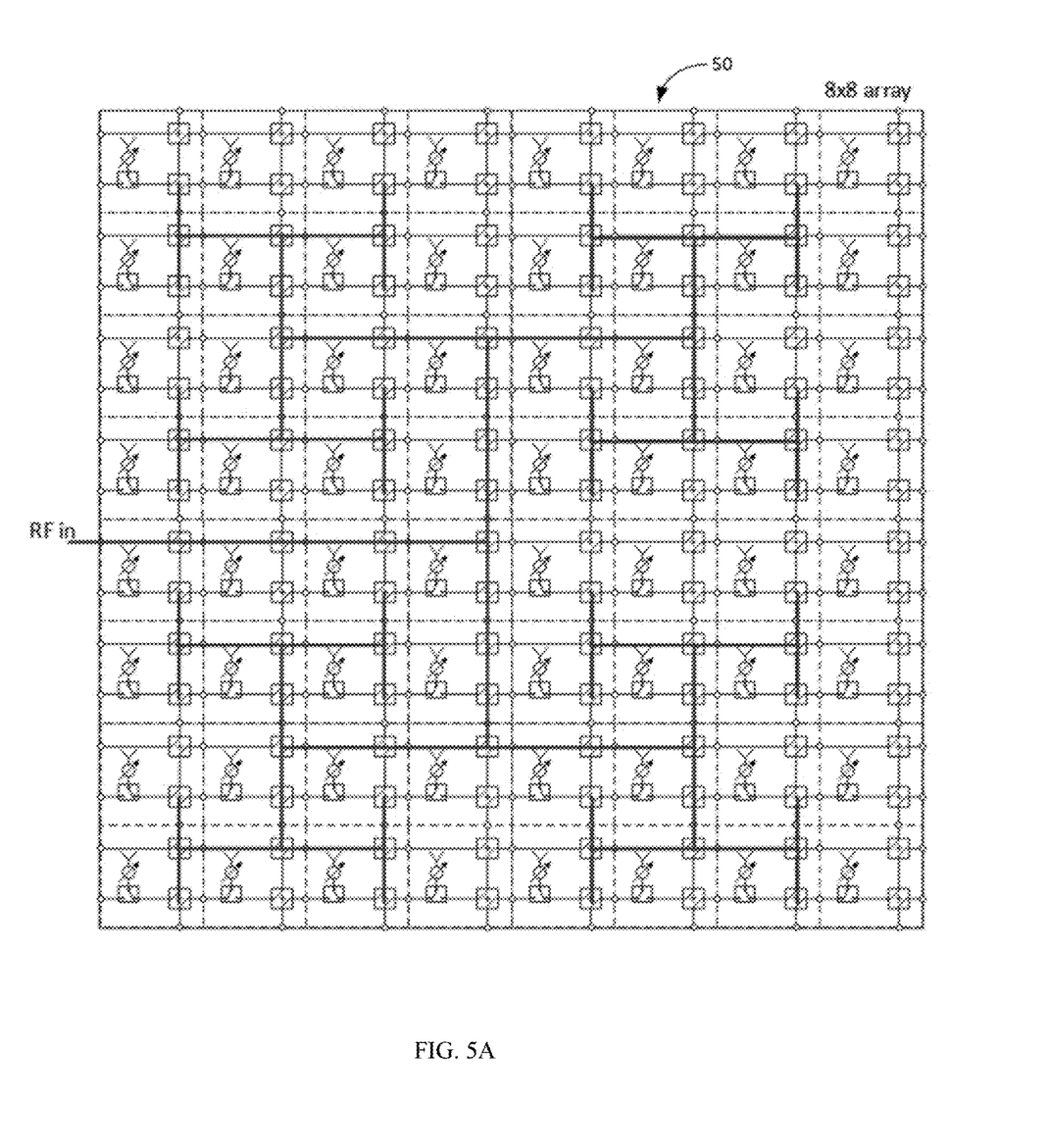
Figure 5B:
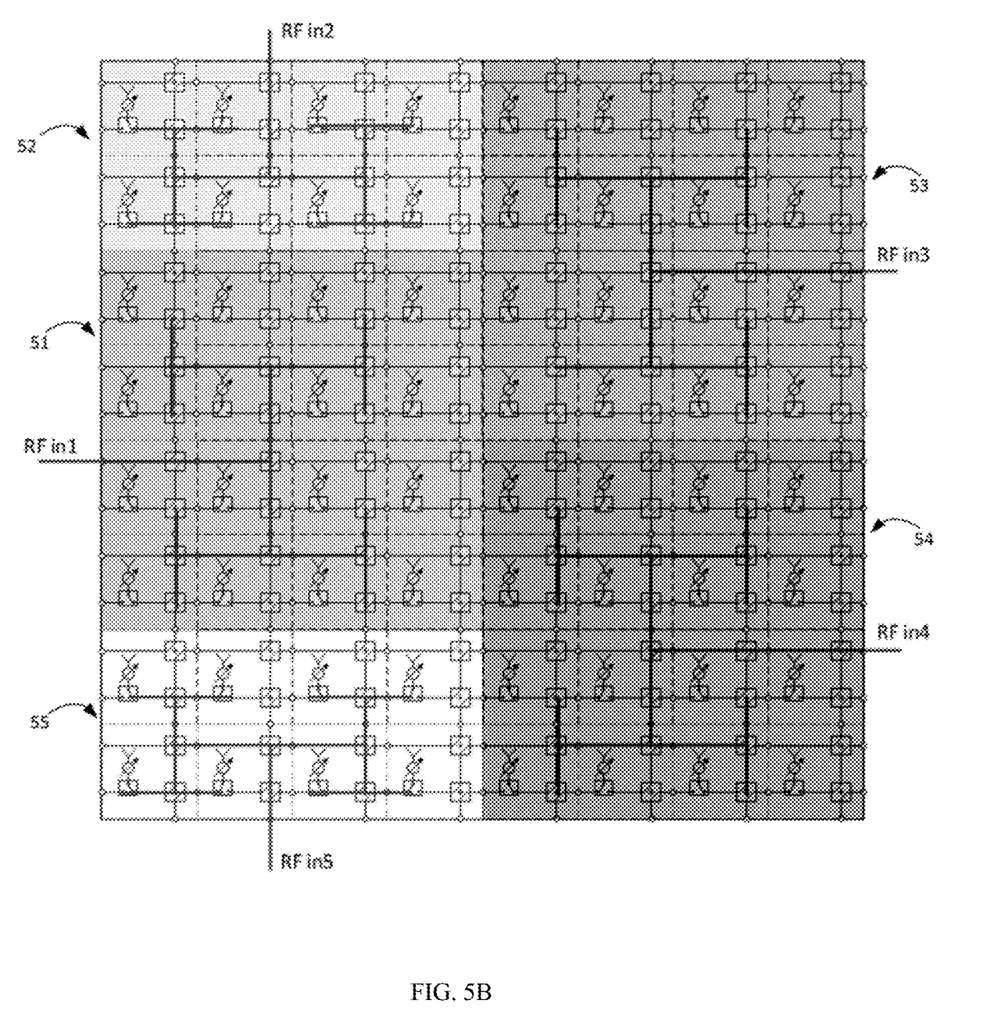
Figure 6:
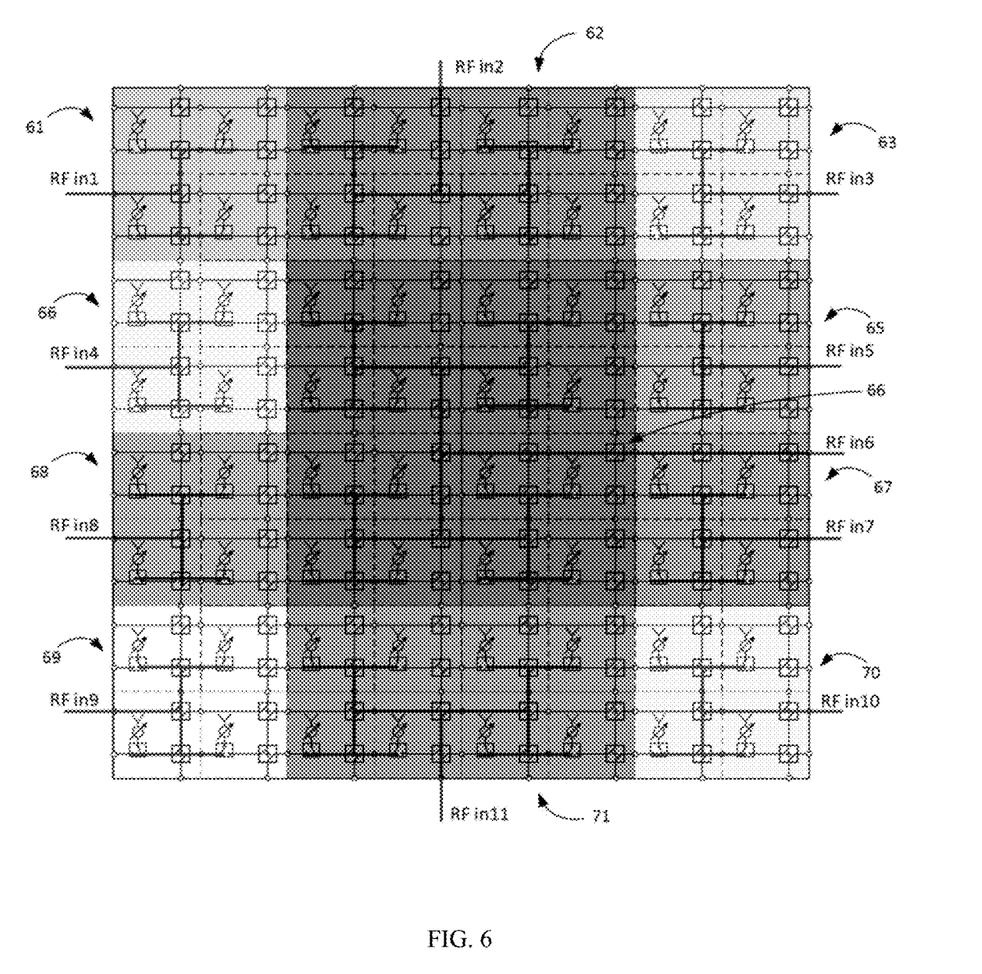

FIGS. 4 to 6 show examples of reconfiguration utilization of a phased array antenna composed of a plurality of unit cells.

FIG. 4 shows a phased array antenna 30 in which unit cells are arranged in a 4×4 array, and FIGS. 5A, 5B, and 6 show a phased array antenna 40 in which unit cells are arranged in an 8×8 array.

As shown in (a) of FIG. 4 and FIG. 5A, in the phased array antennas 30 and 40 of the embodiment, the entire individual chip separated by sawing from a wafer can operate as a single array antenna. In this case, a feed signal (RF in) is input to one unit cell located outside among the plurality of unit cells 10 of the phased array antennas 30 and 40, and the feed signal input to one unit cell is gradually transmitted from the input unit cell to adjacent unit cells. It is preferable that the feed signal is distributed with equal power over the entire area of the phased array antennas 30 and 40, and therefore, in general, the feed signal is hierarchically distributed in an H-shape and transmitted. Since the distribution technique of the feed signal is a well-known technique, it will not be described in detail here.

This is the same operation method as the conventional phased array antenna, and as described above, in the conventional phased array antenna, not only the cell structure but also the transmission path of the feed signal is predetermined during design, and the feed signal can be distributed only through the determined transmission path. Therefore, if a phased array antenna designed on a wafer is implemented, it can operate only in the designed manner.

In contrast, in the phased array antennas 30 and 40 of the embodiment, even after being implemented at the wafer level, by controlling the two path changeover switches 11 and 12 and the selection switch 13, it is possible to variously change the transmission and distribution paths of feed signals at the level of individual unit cells 10. As such, if the transmission and distribution path of the feed signal can be changed in various ways at the level of the unit cell 10, the already implemented single phased array antennas 30 and 40 may be divided and reconfigured into a plurality of sub-phased array antennas to be used, by grouping a plurality of unit cells 10 according to the surrounding environment or application.

(b) of FIG. 4 shows a case in which a phased array antenna 30 in which unit cells are arranged in a 4×4 array is divided and reconfigured into three sub-phased array antennas 41 to 43. Among the three sub-phased array antennas 41 to 43, the first sub-phased array antenna 41 was reconfigured to have unit cells arranged in a 4×2 array, and the second and third sub-phased array antennas 42 and 43 each were reconfigured to have unit cells arranged in a 2×2 array.

Meanwhile, FIG. 5B shows a case in which a phased array antenna 50 in which unit cells are arranged in an 8×8 array is divided and reconfigured into five sub-phased array antennas 51 to 55, and FIG. 6 shows a case in which it is divided and reconfigured into eleven sub-phased array antennas 61 to 71.

In FIG. 5B, among the five sub-phased array antennas 51 to 55, the first, third, and fourth sub-phased array antennas 51, 53 and 54 were divided and reconfigured such that the unit cells have a 4×4 array, whereas the second and fifth sub-phased array antennas 52 and 55 were divided and reconfigured such that the unit cells have a 2×4 array. In FIG. 6, among the eleven sub-phased array antennas 61 to 71, the first, third to fifth, and seventh to tenth sub-phased array antennas 61, 63 to 65, and 67 to 70 were divided and reconfigured such that the unit cells have a 2×2 array, the second and eleventh sub-phased array antennas 62 and 71 were divided and reconfigured such that the unit cells have a 2×4 array, and the sixth sub-phased array antenna 66 located at the center of the phased array antenna 50 was divided and reconfigured such that the unit cells have a 4×4 array.

As shown in FIGS. 4 to 6, a plurality of unit cells 10 included in the phased array antennas 40 and 50 according to the embodiment can be divided and reconfigured in various forms to configure a plurality of sub-phased array antennas (41 to 43), (51 to 55), and (61 to 71) having arbitrary sizes and patterns.

Here, as shown in FIGS. 4 to 6, each of the plurality of sub-phased array antennas (41 to 43), (51 to 55), and (61 to 71) may receive feed signals independently, adjust phases, and radiate signals. That is, each of the plurality of sub-phased array antennas (41 to 43), (51 to 55), and (61 to 71) can operate as an individual antenna, and to this end, each sub-phased array antenna (41 to 43), (51 to 55), and (61 to 71) configures an individual feed signal transmission path. In other words, by dividing and grouping a plurality of unit cells 10 according to transmission paths through which a plurality of feed signals independently applied to the phased array antennas 40 and 50 are transmitted, the phased array antennas 40 and 50 can be divided into a plurality of sub-phased array antennas (41 to 43), (51 to 55), and (61 to 71).

In this case, a plurality of sub-phased array antennas (41 to 43), (51 to 55), and (61 to 71) divided and reconfigured from the single phased array antennas 40 and 50 may receive the same feed signal, or different feed signals. When all of a plurality of sub-phased array antennas (41 to 43), (51 to 55), and (61 to 71) receive different feed signals, all of the plurality of sub-phased array antennas (41 to 43), (51 to 55), and (61 to 71) can operate as individual antennas. However, when two or more sub-phased array antennas among a plurality of sub-phased array antennas (41 to 43), (51 to 55), and (61 to 71) receive the same feed signal, sub-phased array antennas receiving the same feed signal can operate as a multiple-input and multiple-output (MIMO) antenna.

In particular, in the case of the sixth sub-phased array antenna 66 in FIG. 6, it can be seen that, although it is located in the center of the phased array antenna 50 and surrounded by a plurality of sub-phased array antennas 61 to 65 and 67 to 71, it can receive a feed signal RF in6 through the first path changeover switch 11 of the unit cell not utilized for distribution of the feed signal in the seventh sub-phased array antenna 67. That is, the seventh sub-phased array antenna 67 receives the feed signal RF in6 for the sixth sub-phased array antenna 66 as well as its own feed signal RF in7, so that while the feed signal RF in7 can be distributed to a plurality of unit cells of the seventh sub-phased array antenna 67, the feed signal RF in6 can be transmitted to one unit cell among a plurality of unit cells of the sixth sub-phased array antenna 66.

As a result, the phased array antennas 40 and 50 of the embodiment can be used as a single antenna equipped with a plurality of unit cells 10, but can also be used as a plurality of sub-phased array antennas by dividing and reconfiguring a plurality of unit cells 10 into various arbitrary combinations according to the application or environment. Therefore, utilization of the phased array antennas 40 and 50 can be maximized.

Figure 7:
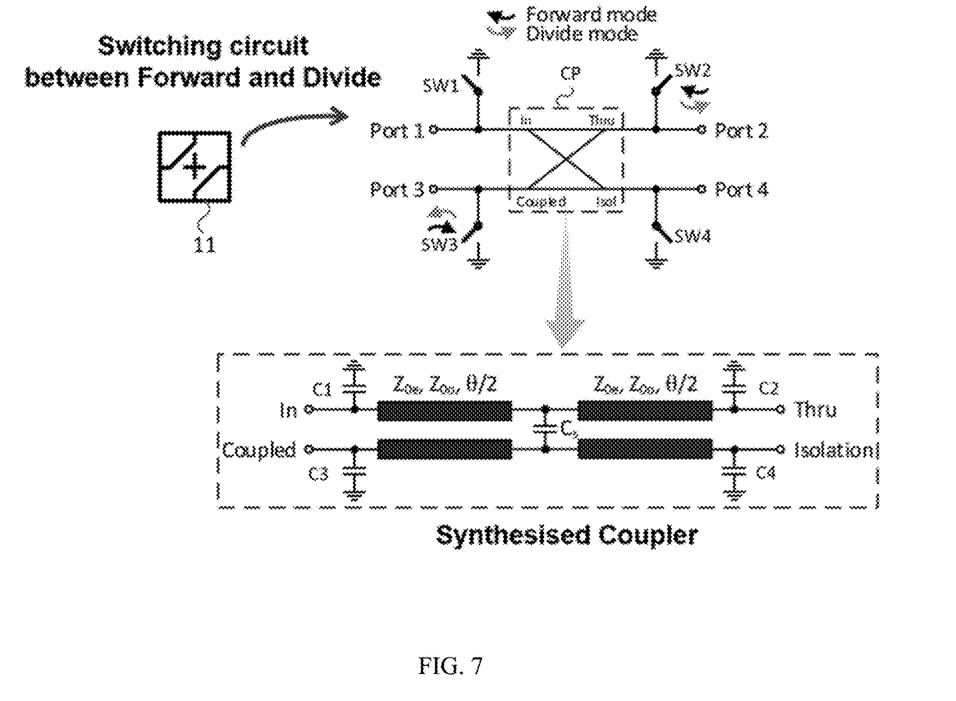
FIGS. 7 and 8 show implementation examples of a path changeover switch in the unit cell of FIG. 1.
Figure 8:
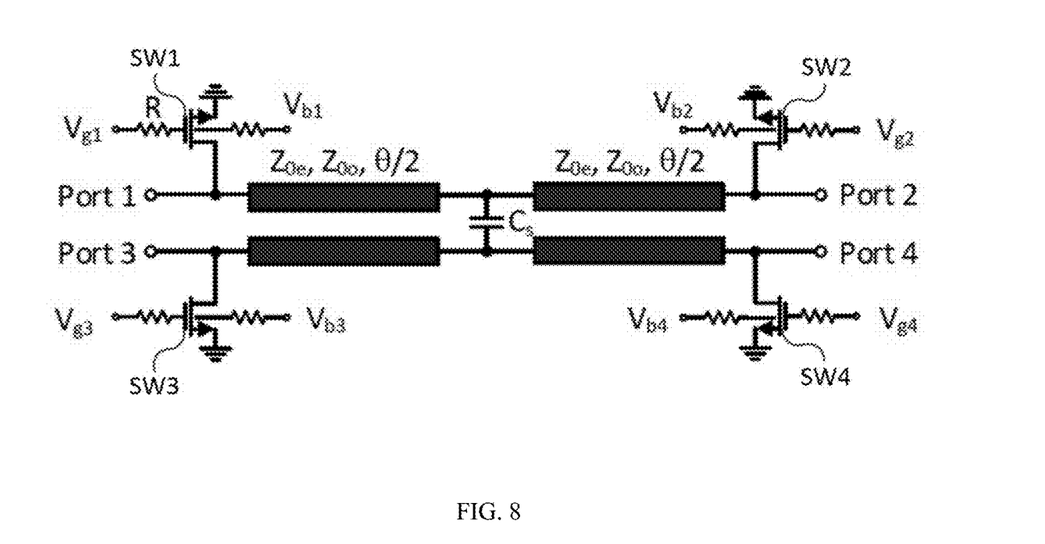
Figure 9:
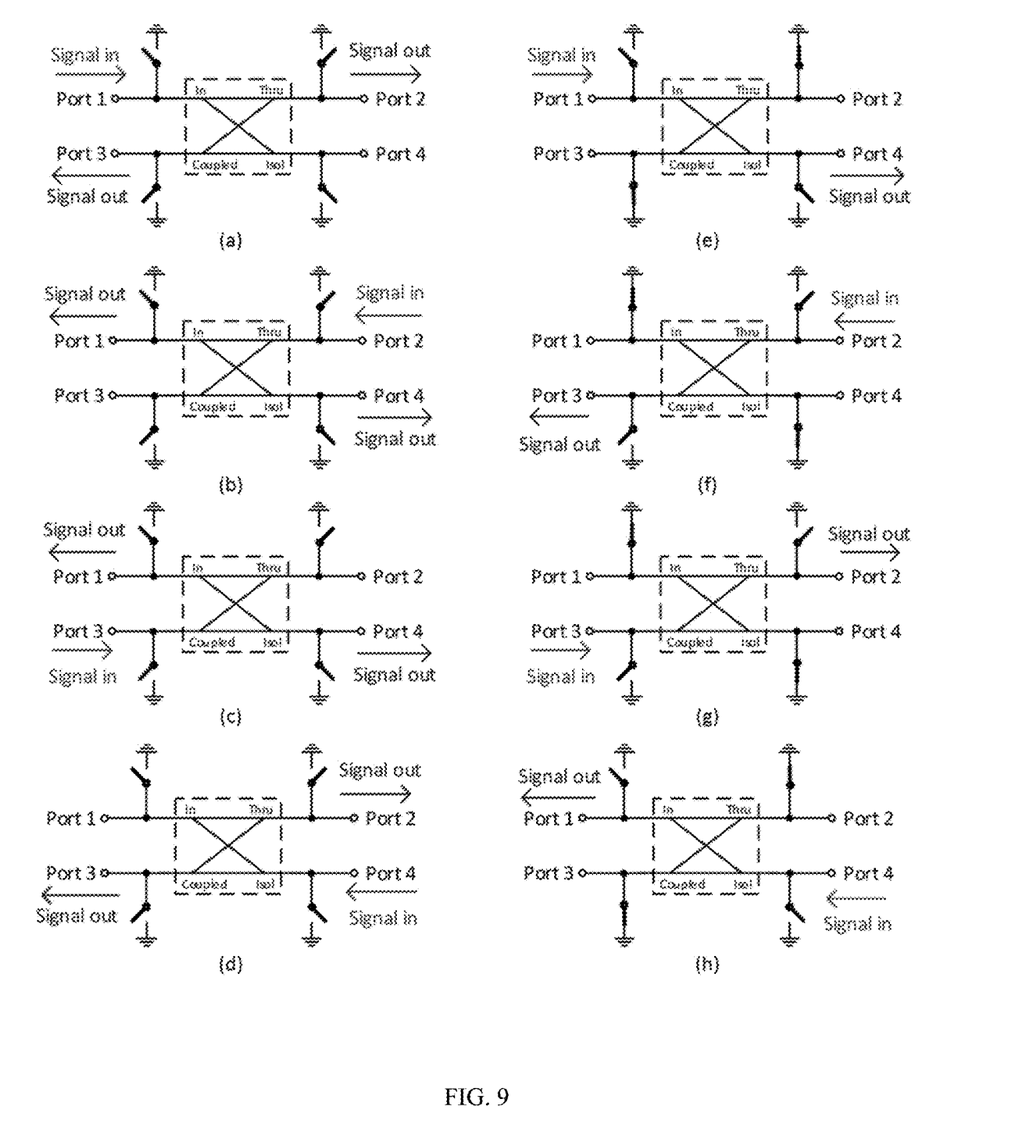
FIG. 9 is a diagram for explaining an operation according to a mode of the path changeover switch of FIG. 7.

FIGS. 7 and 8 show implementation examples of a path changeover switch in the unit cell of FIG. 1, and FIG. 9 is a diagram for explaining an operation according to a mode of the path changeover switch of FIG. 7.

As shown in FIGS. 7 and 8, in the embodiment, each of the two path changeover switches 11 and 12 included in each unit cell 10 may include a coupler CP and four switches SW1 to SW4. Here, the coupler CP may be implemented with a line coupler including a pair of coupling lines disposed parallel to each other to perform mutual coupling. In addition, at both ends of each of the pair of coupling lines, ports Port1 to Port4 to which a feed signal is applied or output may be configured. That is, the feed signal may be input to one of the four ports Port1 to Port4 in the path changeover switches 11 and 12, and may be output through another one or two of the four ports Port1 to Port4.

The four switches SW1 to SW4 may be implemented with MOS transistors (here, NMOS transistors) connected between a corresponding port among the four ports Port1 to Port4 and a ground voltage. As such, when the switches SW1 to SW4 are implemented with MOS transistors, each switch SW1 to SW4 can be turned on or off in response to the voltage $V_{g1}$ to $V_{g4}$ applied to the gate, and due to parasitic capacitance in the off state of each switch SW1 to SW4, the length of a pair of coupling lines to be coupled can be reduced. That is, the size of the path changeover switches 11 and 12 can be reduced.

Here, the four switches SW1 to SW4 determine the operation mode of the path changeover switches 11 and 12, and according to the operation mode determined by the four switches SW1 to SW4, the path changeover switches 11 and 12 can operate in one of a forward mode, a divide mode and an isolation mode.

In the forward mode, as shown in (e) to (h) of FIG. 9, among the four switches SW1 to SW4, two switches positioned diagonally to each other are turned off and two switches are turned on. When a feed signal is applied to one port, where the switch is turned off, of the four ports Port1 to Port4, a switch located diagonally to the port to which the feed signal is applied transmits the feed signal to the port that is likewise turned off, such that the feed signal proceeds as it is along the applied forward direction. That is, the feed signal can be input and output through two ports in which connected switches are turned off. Accordingly, the feed signal may be applied to any of the four ports Port1 to Port4, and the port to which the feed signal is output can be determined according to the port to which the feed signal is applied.

On the other hand, in the divide mode, as shown in (a) to (d) of FIG. 9, all four switches SW1 to SW4 remain turned off. In this case, when a feed signal is applied to one of the four ports Port1 to Port4, the feed signal is divided at the coupler CP and distributed and transmitted to two ports. At this time, the feed signal is distributed and transmitted to the remaining two ports except for ports located in the diagonal direction from the port to which the feed signal is applied.

The isolation mode is a mode in which a feed signal input to one port is not transmitted to another port, and can be driven by turning on all four switches SW1 to SW4, but since the phased array antenna of the embodiment may not utilize the corresponding mode, detailed descriptions thereof are omitted here.

A distribution capacitor $C_S$ may be connected between the pair of couplings. When the path changeover switches 11 and 12 operate in the divide mode, the distribution capacitor $C_S$ equalizes the power of the feed signal divided into two.

In addition, in order to reduce transmission loss of the feed signal, the path changeover switches 11 and 12 may apply a body bias voltage of a designated voltage level (here, 3V as an example) to the bodies of two switches turned on in the forward mode among the four switches SW1 to SW4.

In addition, the size of the path changeover switches 11 and 12 may be adjusted such that the power of the feed signals output in the forward mode and the divide mode are all the same so as to easily compensate for line loss.

Figure 10:
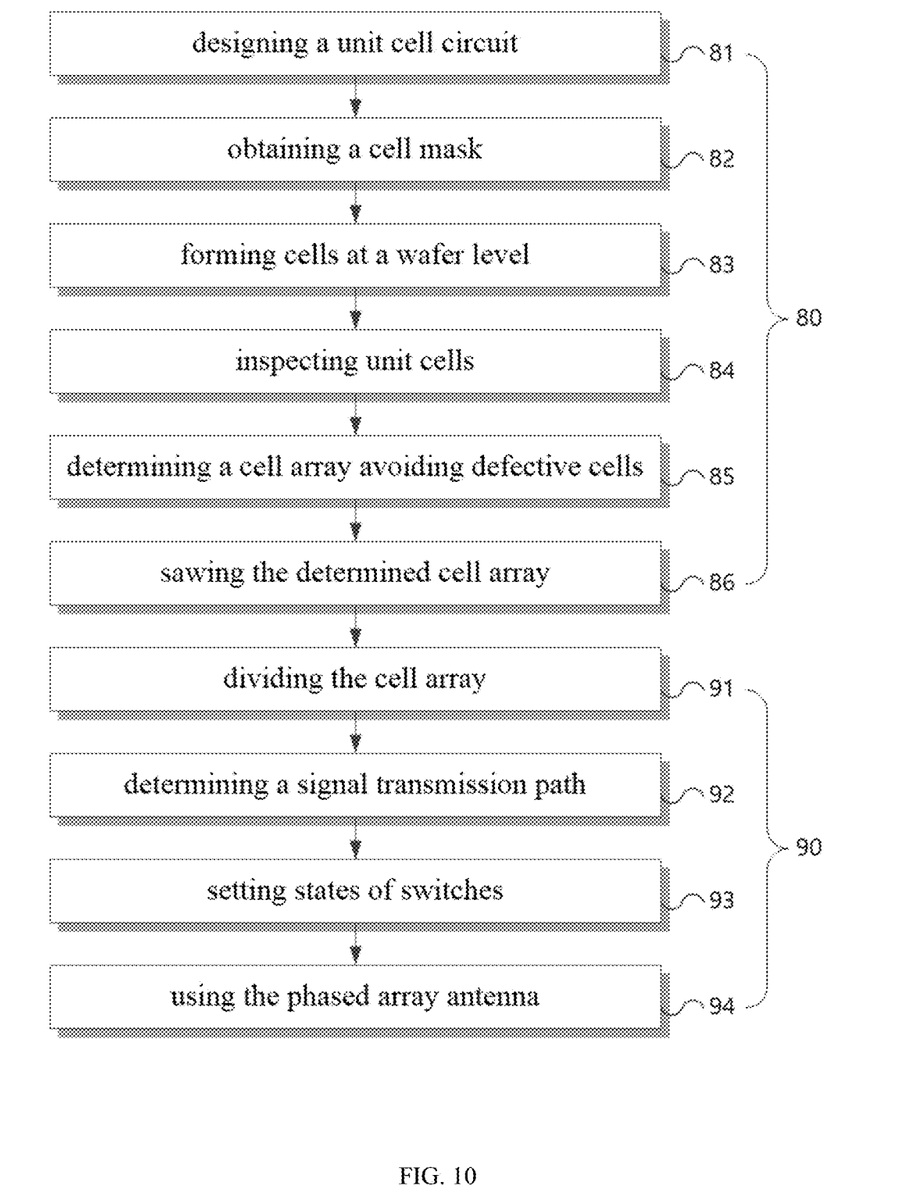
FIG. 10 shows a method for manufacturing a phased array antenna according to an embodiment.

FIG. 10 shows a method for manufacturing a phased array antenna according to an embodiment.

Referring to FIGS. 1 to 9, the method for manufacturing a phased array antenna of FIG. 10 is explained as follows. First, a unit cell circuit for configuring a phased array antenna is designed as shown in FIG. 1 (S81). Then, a cell mask 21 is obtained for implementing the unit cell 10 on the wafer according to the designed unit cell circuit (82). Here, the cell mask 21 may be a mask for implementing a single unit cell, but may also be a mask for implementing a plurality of arrayed unit cells. When the cell mask 21 is obtained, a plurality of unit cells are formed at the wafer level while the obtained cell mask 21 is moved on the wafer 23 (83). When a plurality of unit cells are formed on the wafer 23, the plurality of unit cells 10 formed on the wafer 23 are inspected to identify defective cells (84). Forming a plurality of unit cells 10 on the wafer 23 and inspecting the formed unit cells are steps according to a general semiconductor manufacturing process, so detailed descriptions thereof are omitted here.

If defective cells are identified among the plurality of unit cells 10 formed on the wafer, the number and pattern of unit cells 10 to be included are checked in order to implement a phased array antenna by avoiding the identified defective cells, and at least one cell array to be divided from each other on the wafer is determined according to the checked number and pattern of the unit cells 10 (85). At this time, the size and shape of the determined at least one cell array may be different from each other, and may be determined in an arbitrary size and form. When the size and form of the cell array are determined, each of the at least one cell array is separated from the wafer 23 by sawing according to the determined size and form (86).

The steps from designing a unit cell circuit (81) to sawing a cell array (86) are semiconductor manufacturing processes at a wafer level, and may be referred to as a wafer-level cell array manufacturing step (80). The following steps are processes in which a feed signal transmission path is set for the cell array manufactured at a wafer level so that the cell array can be used as a phased array antenna, and may be referred to as a phased array antenna building step (90).

Each of the separated at least one cell array may be used as a phased array antenna. However, since the transmission path through which the feed signal is distributed is not set in the divided cell array, it cannot be used as it is. In addition, before a transmission path for a feed signal is determined, it is necessary to determine whether to use the entire cell array as one phased array antenna or to distribute and use a plurality of sub-phased array antennas. Accordingly, if it is determined to use the cell array as a plurality of sub-phased array antennas, the cell array is divided into a plurality of sub-arrays (91).

In the case of using the entire cell array or divided cell arrays, a transmission path through which a feed signal is transmitted is determined in each sub-array (92). When the transmission path of the feed signal is determined in the cell array or sub-array, the states of the two path changeover switches 11 and 12 and the selection switch 13 of the unit cells included in each cell array or sub-array are determined according to the determined transmission path (93). At this time, the two changeover switches 11 and 12 each control the included four switches SW1 to SW4, to determine the forward mode or divide mode, and a port to which a feed signal is applied and a port to which a feed signal is transmitted can be determined according to the determined transmission path. When the port to which a feed signal is applied and the port to which a feed signal is transmitted are determined in the two changeover switches 11 and 12, a terminal to which a feed signal is applied and a terminal to which a feed signal is transmitted are also determined among the six terminals T1 to T6 of the unit cell 10. At this time, each unit cell 10 may also be set such that the two changeover switches 11 and 12 receive and transmit different feed signals.

In addition, the selection switch 13 is set to select one of the second changeover switch 12 in the same unit cell 10 or the second changeover switch 12 of the adjacent unit cell and to electrically connect it with a radiating element.

When the state of the switch is set, since the phased array antenna is configured, the phased array antenna is used (94).

In some cases, by changing the state of the switch even when a phased array antenna is already in use by setting the switch state, a plurality of unit cells 10 included in the phased array antenna can be divided and reconfigured in various combinations to be used as a plurality of sub-phased array antennas. Conversely, by grouping all of the plurality of unit cells 10 of the plurality of sub-phased array antennas and resetting the transmission path of the feed signal, it can also be used as a single phased array antenna. That is, even during use of the phased array antenna, the phased array antenna can be divided and reconfigured according to the application or environment.

In the above description, it was assumed that the switch state is performed after the cell array is separated from the wafer 23 in consideration of the case of division and reconfiguration even during the use of the phased array antenna, but in the case where the phased array antenna is not used by being divided and reconfigured into a plurality of sub-phased array antennas, the states of the two path changeover switches 11 and 12 and the selection switch 13 may also be previously determined by hardware before the cell array is separated from the wafer 23.

In FIG. 10, it is described that each process is sequentially executed, but this is only illustratively described, and a person skilled in the art may change and execute the sequence shown in FIG. 10 within the range not departing from the essential characteristics of the embodiment of the present disclosure, or may apply various modifications and variations by executing one or more processes in parallel or adding another process.

Although the present disclosure has been described in detail through representative examples above, a person having ordinary skill in the art would understand that many variations and other equivalent embodiments can be derived from the embodiments described herein. Therefore, the true technical scope of the present disclosure is to be defined by the technical spirit set forth in the appended scope of claims.

What is claimed is:

1. A phased array antenna comprising a plurality of unit cells arranged in an array,
   wherein each of the plurality of unit cells comprises:
   at least one radiating element receiving a feed signal and radiating a signal; and
   two path changeover switches for transmitting the feed signal as it is or as a distribution to the at least one radiating element, or at least one unit cell disposed adjacent, under control of an antenna control circuit,
   wherein each of the two path changeover switches operates in one of a forward mode in which the feed signal is transmitted in a forward direction, and a divide mode in which the feed signal is divided into two and transmitted in both side directions of the forward direction, under the control of the antenna control circuit,
   such that the feed signal is transmitted to another path changeover switch in the same unit cell or the at least one radiating element or at least one adjacently disposed unit cell.

2. The phased array antenna according to claim 1,
   wherein the phased array antenna is manufactured and implemented on a wafer, and is obtained in multiple numbers by sawing so that the plurality of unit cells are included in different numbers and patterns according to application in the wafer.

3. The phased array antenna according to claim 1,
   wherein the phased array antenna is manufactured and implemented on a wafer, and, when at least one unit cell among the plurality of unit cells implemented on the wafer is determined to be defective, is obtained by changing a location on the wafer or by changing a number and pattern of included unit cells, so that the unit cells determined to be defective are excluded.

4. The phased array antenna according to claim 1,
   wherein the phased array antenna is divided and reconfigured into a plurality of sub-phased array antennas by grouping the plurality of unit cells with a number corresponding to the number of feed signals independently input to the phased array antenna.

5. The phased array antenna according to claim 4,
   wherein each of the plurality of sub-phased array antennas receives a feed signal through one unit cell among a plurality of included unit cells, and
   the two path changeover switches are controlled such that a feed signal input to one unit cell by the antenna control circuit is transmitted between unit cells within the same sub-phased array antenna.

6. The phased array antenna according to claim 1,
   wherein the two path changeover switches include:

a first path changeover switch that transmits the feed signal to at least one of the adjacently disposed unit cell and another path changeover switch in the same unit cell; and a second path changeover switch that transmits the feed signal to at least one of the at least one radiating element and the first path changeover switch in the same unit cell and the adjacently disposed unit cell.

7. The phased array antenna according to claim 6,
wherein each of the plurality of unit cells further includes
a selection switch that selects one of the second path changeover switch in the same unit cell or the second path changeover switch of an adjacent unit cell, and transmits a feed signal applied through the selected second path changeover switch to the at least one radiating element.

8. The phased array antenna according to claim 1,
wherein each of the two path changeover switches includes:
a line coupler including a pair of coupling lines disposed parallel to each other to achieve mutual coupling; and
four mode switches, connected between each of four ports to which the feed signal is applied or output to both ends of each of the pair of coupling lines and a ground voltage, and turned on or off under the control of the antenna control circuit to determine an operation mode of a path changeover switch and a transmission direction of the feed signal.

9. The phased array antenna according to claim 8,
wherein in the four mode switches,
when the path changeover switch operates in the forward mode, two mode switches connected to a port to which the feed signal is applied and a port to which the feed signal is to be transmitted are turned off and the remaining two mode switches are turned on, and
when the path changeover switch operates in the divide mode, all of the four mode switches are turned off.

10. The phased array antenna according to claim 8,
wherein each of the two path changeover switches further includes
a distribution capacitor connected between the pair of coupling lines.

11. The phased array antenna according to claim 10,
wherein each of the plurality of unit cells further includes
a phase control circuit for adjusting a phase of the feed signal applied to the at least one radiating element under the control of the antenna control circuit.

12. A method for manufacturing a phased array antenna comprising the steps of:
arranging, on a wafer, a plurality of unit cells comprising at least one radiating element receiving a feed signal and radiating a signal and two path changeover switches for transmitting the feed signal as it is or as a distribution to the at least one radiating element, or at least one unit cell disposed adjacent, under control of an antenna control circuit;
obtaining at least one cell array by dividing and sawing the plurality of unit cells into different numbers and patterns according to application in the plurality of unit cells arranged in an array on the wafer; and
configuring the phased array antenna by controlling the two path changeover switches such that a transmission path through which the feed signal is transmitted is determined in a plurality of unit cells included in each cell array obtained by the antenna control circuit, and the feed signal is transmitted according to the transmission path,
wherein in the step of configuring the phased array antenna,
a mode of each of the two path changeover switches is set to one of a forward mode in which the feed signal is transmitted in a forward direction, and a divide mode in which the feed signal is divided into two and transmitted in both side directions of the forward direction, by the antenna control circuit,
such that the feed signal is transmitted to another path changeover switch in the same unit cell or the at least one radiating element or at least one adjacently disposed unit cell.

13. The method for manufacturing a phased array antenna according to claim 12,
wherein the step of obtaining at least one cell array includes, when at least one unit cell among the plurality of unit cells implemented on the wafer is determined to be defective, changing a position where the cell array is obtained on the wafer or changing a number and pattern of included unit cells such that the unit cells determined to be defective are excluded.

14. The method for manufacturing a phased array antenna according to claim 12,
wherein the method further includes a step of dividing and reconfiguring the phased array antenna into a plurality of sub-phased array antennas by grouping the plurality of unit cells with a number corresponding to the number of the feed signal independently input to the phased array antenna.

15. The method for manufacturing a phased array antenna according to claim 14,
wherein in the step of dividing and reconfiguring, the two path changeover switches are controlled by the antenna control circuit such that a feed signal applied through one unit cell included in a sub-phased array antenna is transmitted between unit cells included in the same sub-phased array antenna.

16. The method for manufacturing a phased array antenna according to claim 12,
wherein, among the two path changeover switches, a first path changeover switch is set to a mode to transmit the feed signal to at least one of an adjacently disposed unit cell and another path changeover switch within the same unit cell, and
a second path changeover switch is set to a mode to transmit the feed signal to at least one of the at least one radiating element, the first path changeover switch in the same unit cell and an adjacently disposed unit cell.

17. The method for manufacturing a phased array antenna according to claim 16,
wherein the step of configuring the phased array antenna includes selecting one of the second path changeover switch in the same unit cell or a second path changeover switch of an adjacent unit cell, such that the at least one radiating element receives the feed signal through the selected second path changeover switch.

18. The method for manufacturing a phased array antenna according to claim 12,
wherein each of the plurality of unit cells is implemented by further including a phase control circuit for adjusting a phase of the feed signal applied to the at least one radiating element.

* * * * *